US009893278B1

United States Patent
Chuang et al.

(10) Patent No.: US 9,893,278 B1
(45) Date of Patent: Feb. 13, 2018

(54) EMBEDDED MEMORY DEVICE BETWEEN NONCONTIGOUS INTERCONNECT METAL LAYERS

(71) Applicant: Taiwan Semiconductor Manufacturing Co., Ltd., Hsin-Chu (TW)

(72) Inventors: Harry-Hak-Lay Chuang, Zhubei (TW); Chun-Heng Liao, Xindian (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/230,690

(22) Filed: Aug. 8, 2016

(51) Int. Cl.
*H01L 47/00* (2006.01)
*H01L 45/00* (2006.01)
*H01L 27/22* (2006.01)

(52) U.S. Cl.
CPC ........ *H01L 45/1233* (2013.01); *H01L 27/222* (2013.01)

(58) Field of Classification Search
USPC ............ 257/4, 295, E43.011–E43.007, 257/E27.005–E27.006, E27.008, E29.164, 257/E19.167, E29.272, E29.323, 257/314–326, E27.078, E29.3, E29.309, 257/255–266, E21.179–E21.182, 257/E21.209–E21.21, E21.422, E21.423, 257/E21.679–E21.694, 68–71, 296–309, 257/905–908, E21.646–E21.66, E29.17, 257/E27.075; 438/3, 785, E21.208; 365/158, 171, 173, 55
See application file for complete search history.

(56) References Cited

U.S. PATENT DOCUMENTS

| 2010/0193850 A1* | 8/2010 | Asao ............... H01L 27/228 257/295 |
| 2012/0032284 A1* | 2/2012 | Dejima ........... H01L 31/0203 257/415 |
| 2013/0064001 A1* | 3/2013 | Terai ............... H01L 45/04 365/148 |
| 2014/0203236 A1* | 7/2014 | Chen ............... H01L 45/16 257/4 |
| 2015/0032960 A1* | 1/2015 | Dong ............... G06F 12/0842 711/118 |

(Continued)

*Primary Examiner* — Tram H Nguyen
(74) *Attorney, Agent, or Firm* — Eschweiler & Potashnik, LLC

(57) ABSTRACT

The present disclosure relates an integrated circuit (IC). The IC comprises a memory region and a logic region. A lower metal layer is disposed over a substrate, and comprises a first lower metal line within the memory region. An upper metal layer overlies the lower metal layer, and comprises a first upper metal line within the memory region. A memory cell is disposed between the first lower metal line and the first upper metal line, and comprises a planar bottom electrode. The planar bottom electrode abuts a first lower metal via of the lower metal layer. By forming the planar bottom electrode and connecting the planar bottom electrode to the lower metal layer through the lower metal via, no additional BEVA planarization and/or patterning processes are needed. As a result, risk of damaging the lower metal lines are reduced, thereby providing more reliable read/write operations and/or better performance.

20 Claims, 9 Drawing Sheets

(56) References Cited

U.S. PATENT DOCUMENTS

| | | | |
|---|---|---|---|
| 2015/0052302 A1* | 2/2015 | Dong | H01L 43/08 |
| | | | 711/118 |
| 2015/0102459 A1 | 4/2015 | Lai et al. | |
| 2015/0171314 A1* | 6/2015 | Li | G11C 11/161 |
| | | | 257/421 |

* cited by examiner

US 9,893,278 B1

EMBEDDED MEMORY DEVICE BETWEEN NONCONTIGOUS INTERCONNECT METAL LAYERS

BACKGROUND

Many modern electronic devices contain electronic memory configured to store data. Electronic memory may be volatile memory or non-volatile memory. Non-volatile memory is able to store data in the absence of power, whereas volatile memory is not. Magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes. As the size of on-chip components is scaled (i.e., reduced), device "shrinkage" allows engineers to integrate more components and more corresponding functionality onto newer generations of ICs. In recent technology nodes, this has allowed for non-volatile memory to be integrated on an integrated chip with logic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
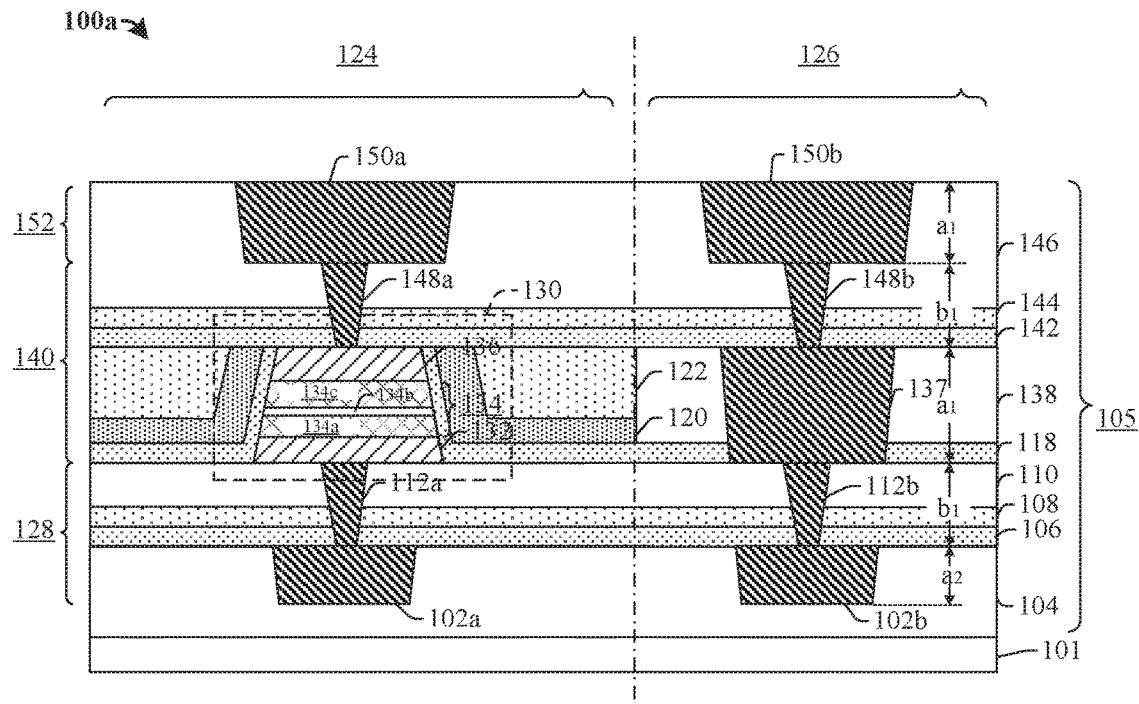
FIG. 1A illustrates a cross-sectional view of some embodiments of an integrated circuit (IC) having a memory cell embedded in an interconnect structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in semiconductor manufacturing is to integrate different types of devices on a single substrate to achieve higher integration. One example is a substrate having a logic region, in which logic devices are formed, and a memory region, in which magnetic random access memory (MRAM) or resistive random access memory (RRAM) devices are formed. To form these memory cells, which are formed within an interconnect structure overlying the substrate, a bottom electrode layer can be overfilled into and over a prepared opening of an inter-level dielectric layer of the interconnect structure, and a chemical mechanical polishing (CMP) and/or a patterning process can be used to planarize the bottom electrode layer and form a bottom electrode via (also called BEVA). In such manufacturing processes, however, chemical mechanical polishing (CMP) may not result in a planar surface over the entire substrate. For example, when the bottom electrode layer (which has a relatively high structural integrity and tends to "resist" CMP relatively well) is present over the memory region but does not extend over the logic region, a metal interconnect line (which has a relatively low structural integrity compared to the bottom electrode layer) may be exposed to CMP in the logic region. Because this metal interconnect line is structurally "weaker" than the bottom electrode, performing CMP on the bottom electrode layer can cause "dishing" of the metal interconnect lines in the logic region. Therefore, after bottom electrode planarization for the memory devices, portions of the metal interconnect lines in the logic region can end up being thinner than in the memory region, possibly even being removed. Consequently, these eroded metal lines can degrade the reliability of the resultant IC. In addition, as the size of on-chip components is scaled, heights of interconnection metal layers and thicknesses of the inter-metal dielectric layers also shrink. Therefore, placing a memory device between two adjacent metal layers might not be applicable.

The present disclosure relates to an improved integrated circuit having an embedded memory device placed between two noncontiguous metal layers and abutting two interconnect metal vias, and associated fabrication methods. In some embodiments, the integrated circuit comprises a memory region and a logic region. A lower metal layer is disposed over a substrate, and comprises a first lower metal line within the memory region and a second lower metal line within the logic region. An upper metal layer overlies the lower metal layer, and comprises a first upper metal line within the memory region and a second upper metal line within the logic region. A memory cell is disposed between the first lower metal line and the first upper metal line, and comprises a planar bottom electrode and a top electrode separated from the bottom electrode by a resistance switching element. The memory cell is respectively connected to the first lower metal line through a first lower metal via abutting the planar bottom electrode and the first upper metal line through a first upper metal via abutting the top electrode. By forming the planar bottom electrode and connecting the planar bottom electrode to the lower metal layer through the lower metal via, no additional BEVA planarization and/or patterning processes are needed. As a result, risk of damaging the lower metal lines are reduced, thereby providing more reliable read/write operations and/or better performance.

Figure 1B:
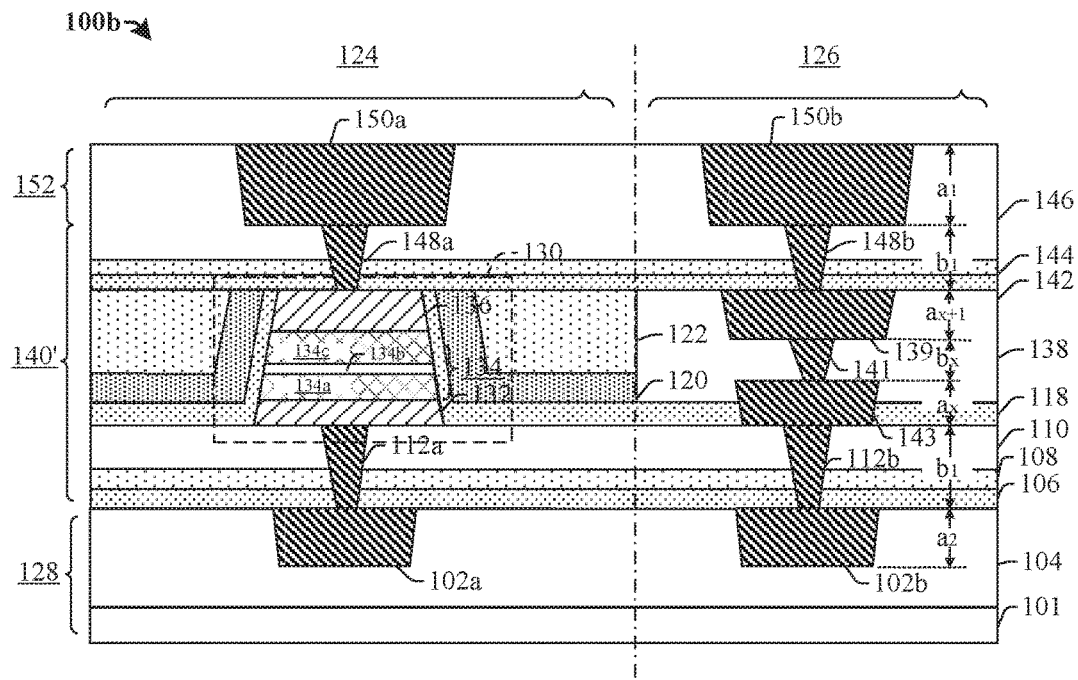
FIG. 1B illustrates a cross-sectional view of some alternative embodiments of an integrated circuit (IC) having a memory cell embedded in an interconnect structure.

FIG. 1A and FIG. 1B respectively show cross-sectional views of integrated circuits (ICs) 100a and 100b disposed over a substrate 101 according to some embodiments. As shown in FIG. 1A and FIG. 1B, an interconnect structure 105 is disposed over a substrate 101 and extends across a memory region 124 and a logic region 126. The memory region 124 can correspond to an array of memory cells (e.g., memory cell 130), which are disposed in the interconnect structure 105, while the logic region 126 can couple logic devices, such as transistors formed in the substrate 101, to support operation of the memory cells.

In some embodiments, the interconnect structure 105 comprises a lower metal layer 128 surrounded by a lower inter-layer dielectric (ILD) layer 104 and an upper metal layer 152 surrounded by an upper ILD layer 146. The lower metal layer 128 and the upper metal layer 152 may comprise copper. The lower metal layer 128 comprises a plurality of lower metal lines laterally aligned one another, such as a first lower metal line 102a at the memory region 124 and a second lower metal line 102b at the logic region 126. The lower metal layer 128 further comprises a plurality of lower metal vias disposed over the lower metal lines, such as a first lower metal via 112a coupled to the first lower metal line 102a and a second lower metal via 112b coupled to the second lower metal line 102b. In some embodiments, a lower etch stop layer 106 and/or a protective liner 108 are disposed directly along upper surfaces of the lower metal lines 102a, 102b and the lower ILD layer 104. A lower low-k dielectric layer 110 is disposed over the protective liner 108 having an upper surface aligned with top surfaces of the lower metal vias 112a, 112b. The lower etch stop layer 106 may comprise silicon carbide, silicon nitride or combination thereof. The protective liner 108 may comprise dielectric material such as TEOS (Tetraethyl Orthosilicate). The upper metal layer 152 overlies the lower metal layer 128 and the lower ILD layer 104. The upper metal layer 152 may comprise a plurality of upper metal lines laterally aligned one another, such as a first upper metal line 150a at the memory region 124 and a second upper metal line 150b at the logic region 126. A plurality of upper metal vias are respectively coupled to the plurality of upper metal lines, including a first upper metal via 148a coupled to the first upper metal line 150a and a second upper metal via 148b coupled to the second lower metal line 150b. In some embodiments, an upper etch stop layer 142 and/or a protective liner 144 are disposed surrounding a lower portion of the upper metal vias 148a, 148b.

Within the memory region 124, a memory cell 130 is disposed between the first lower metal via 112a and the first upper metal via 148a. In some embodiments, the memory cell 130 comprises a bottom electrode 132 abutting the first lower metal via 112a, a resistance switching element 134 over the bottom electrode 132, and a top electrode 136 over the resistance switching element 134. The bottom electrode 132 may have planar top and bottom surfaces and tilted sidewalls. The sidewalls of the bottom electrode 132 may be co-planar with sidewalls of the resistance switching element 134 and the top electrode 136. In some embodiments, the resistance switching element 134 comprises a magnetic tunnel junction (MTJ) including a bottom ferromagnetic layer 134a, a tunnel barrier layer 134b disposed over the bottom ferromagnetic layer 134a, and a top ferromagnetic layer 134c disposed over the tunnel barrier layer 134b. In some embodiments, the bottom electrode 132 and the top electrode 136 may comprise titanium nitride (TiN), tantalum nitride (TaN), tantalum (Ta), and/or titanium (Ti) while the lower and upper metal vias 112a, 148a may comprise copper. In some embodiments, a bottom etch stop layer 118 is disposed across the memory region 124 and the logic region 126 surrounding lower portions of the memory cell 130. A remaining upper portion of the memory cell 130 is surrounded by a spacer layer 120 and/or a memory dielectric layer 122, while a remaining upper portion of the logic region 126 is surrounded by an ILD layer 138.

In some embodiments, referring to FIG. 1A, an intermediate metal layer 140 is disposed between the upper metal layer 152 and the lower metal layer 128 within the logic region 126. The intermediate metal layer 140 comprises an intermediate metal line 137 abutting the second upper metal via 148b and the second lower metal via 112b and having a height substantially equal to a height of the memory cell 130. In some embodiments, the intermediate metal line 137 and the second upper metal line 150b may have a substantially equal height $a_1$. The second lower metal line 102 may have a height $a_2$ smaller than the height $a_1$ of the intermediate metal line 137 and the second upper metal line 150b. In some embodiments, the upper metal vias 148a, 148b and the lower metal vias 112a, 112b may have a substantially equal height $b_1$. For some further scaling nodes, such as 7 nm node and beyond, the height $a_1$ of the metal lines (e.g. 137, 150) may be reduced to be substantially equal to the height $b_1$ of the corresponding metal vias (e.g. 112, 148), while in some current integrated circuits a metal line may have a height greater than a height of a corresponding metal via. By forming the memory cell 130 between noncontiguous metal layers (e.g. the metal layers 152 and 128) and directly between two layers of metal vias (e.g. the metal vias 148a and 112a), memory cell dimension limitations are reduced and no additional BEVA structure is needed.

In some alternative embodiments, referring to FIG. 1B, multiple intermediate metal layers 140' are disposed between the upper metal layer 152 and the lower metal layer 128. For example, a first intermediate metal line 139 and a second intermediate metal line 143 are disposed between the second upper metal via 148b and the second lower metal via 112b and connected by an intermediate metal via 141. In some embodiments, the intermediate metal lines 143, 139 may have heights $a_x$, $a_{x+1}$. The heights $a_x$ or $a_{x+1}$ may substantially equal to the height $a_1$ of the second upper metal line 150b or the height $a_2$ of the second lower metal line 102b. The upper metal vias 148a, 148b and the lower metal vias 112a, 112b may have a substantially equal height $b_1$. The intermediate metal via 141 may have a heights $b_x$. The height $b_x$ may substantially be equal to the height $b_1$ or a height of a metal via under the second lower metal line 102b. By incorporating the memory cell 130 to cross more than one intermediate metal layers, dimensions of metal layers and ILD layers therebetween can be further reduced without being affected by the memory cells limitations.

Figure 2:
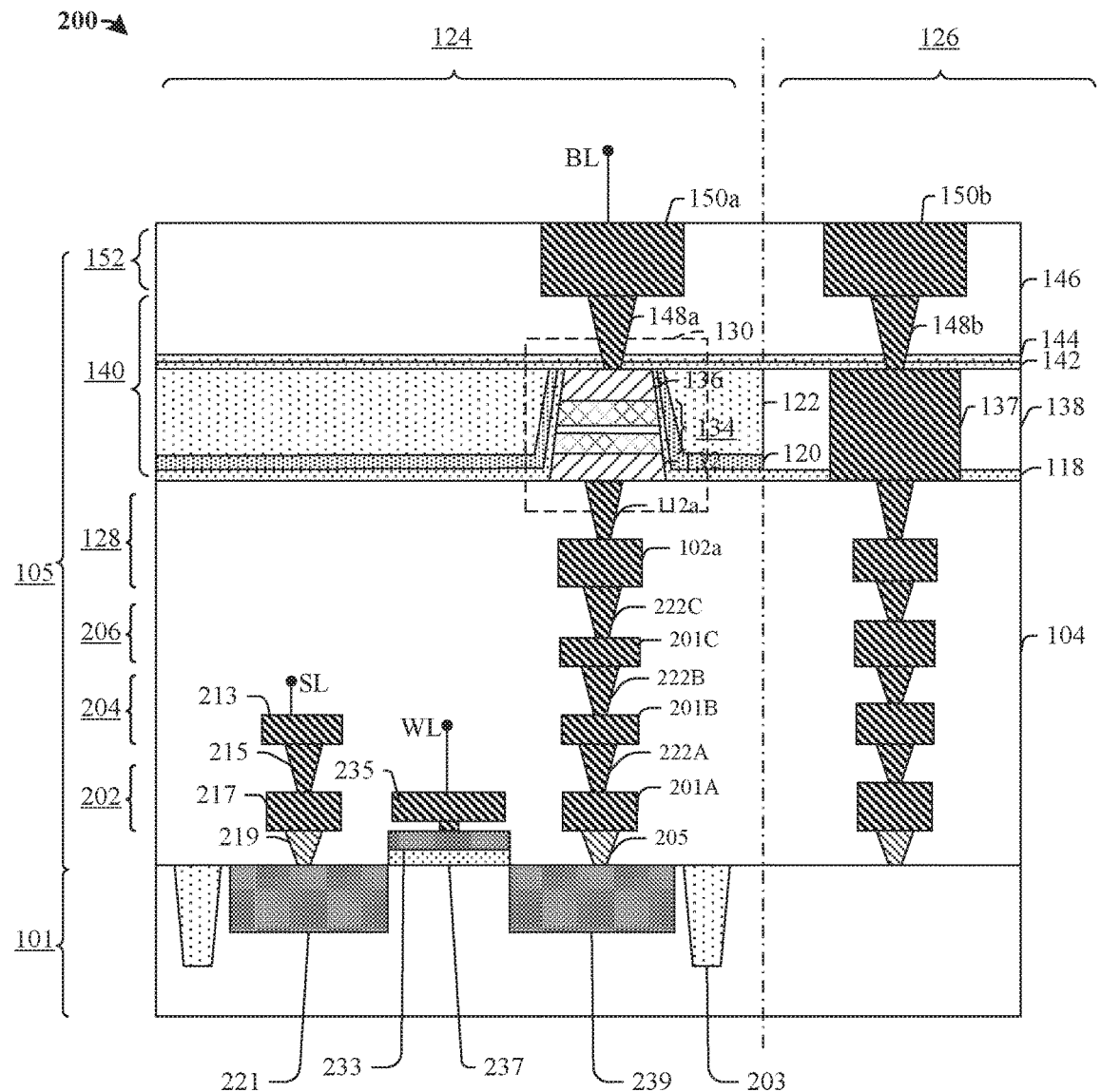
FIG. 2 illustrates a cross-sectional view of some alternative embodiments of an integrated circuit (IC) having a memory cell embedded in an interconnect structure.

FIG. 2 illustrates a cross-sectional view of an integrated circuit (IC) 200 according to some alternative embodiments. As shown in FIG. 2, the IC 200 comprises a substrate 101 and an interconnect structure 105 disposed over the substrate 101 and extending across a memory region 124 and a logic region 126. The interconnect structure 105 can include a plurality of metal layers or other conductive layers, such as first, second, third, fourth, fifth and sixth metal interconnect layers 202, 204, 206, 128, 140 and 152 stacked over one another and disposed over the substrate 101. Metal lines in the metal interconnect layers can be separated from one another by interlayer dielectric (ILD) materials (e.g. 104, 138, 146), such as silicon dioxide or one or more kinds of low-k dielectric materials, and etch stop layers and protective layers (e.g. 118, 142, 144) such as silicon carbide silicon nitride or other dielectric layers. In some embodiments, a memory cell 130 is disposed between the fourth interconnect metal layer 128 and the sixth interconnect metal layer 152 within the memory region 124. In some embodiments, the memory cell 130 comprises a bottom electrode 132, and a top electrode 136, and a resistance switching element 134 separating the top electrode 136 from the bottom electrode 132. In some embodiments, the memory cell 130 is a magnetoresistive random access memory (MRAM) cell and the resistance switching element 134 can comprise a magnetic tunnel junction (MTJ) structure having a bottom ferromagnetic layer and a top ferromagnetic layer separated by a tunnel barrier layer. In some other embodiments, the memory cell 130 is a resistive random access memory (RRAM) cell and the resistance switching element 134 can comprise a RRAM dielectric layer. An intermediate metal line 137 is disposed within the fifth metal interconnect layer 140 between the fourth interconnect metal layer 128 and the sixth interconnect metal layer 152 within the logic region 126. In some embodiments, a bottom etch stop layer 118 is disposed across the memory region 124 and the logic region 126 surrounding lower portions of the memory cell 130 and the intermediate metal line 137. A remaining upper portion of the memory cell 130 is surrounded by a spacer layer 120 and/or a memory dielectric layer 122, while a remaining upper portion of the intermediate metal line 137 is surrounded by an ILD layer 138 having a dielectric material different from the memory dielectric layer 122. The spacer layer 120 may comprise dielectric material such as TEOS (Tetraethyl Orthosilicate).

In some embodiments, within the memory region 124, a transistor is arranged over the substrate 101 and between isolation regions 203. The transistor includes a source region 221, a drain region 239, a gate electrode 233, and a gate dielectric 237. A source line 213 (SL) is connected to the source region 221 through a contact plug 219, a first metal interconnect line 217, and a first metal via 215, which are disposed within one or more ILD layers 104. A word line (WL) 235 for addressing the memory cell 130 is coupled to the gate electrode 233. The bottom electrode 132 of the memory cell 130 is connected to the drain region 239 through a contact plug 205, metal lines 201A-201C and metal vias 222A-222C of the first, second, and third metal interconnect layers 202, 204, and 206, and a first lower metal line 102a and a first lower metal via 112a of the fourth metal interconnect layer 128. In some embodiments, a first upper metal via 148a connects the top electrode 136 of the memory cell 130 to a first upper metal line as a bit line (BL) arranged within the sixth metal interconnect layer 152.

It is appreciated that in this example, the lower metal lines 102a, 102b and the lower metal vias 112a, 112b are located in the fourth metal interconnect layer 128, and the upper metal lines 150a, 150b are located in a sixth metal interconnect layer 152. However, locations of theses metal layers are amenable to any lower or upper noncontiguous metal interconnect layers.

FIGS. 3-13 illustrate some embodiments of cross-sectional views showing a method of forming an integrated circuit device.

Figure 3:
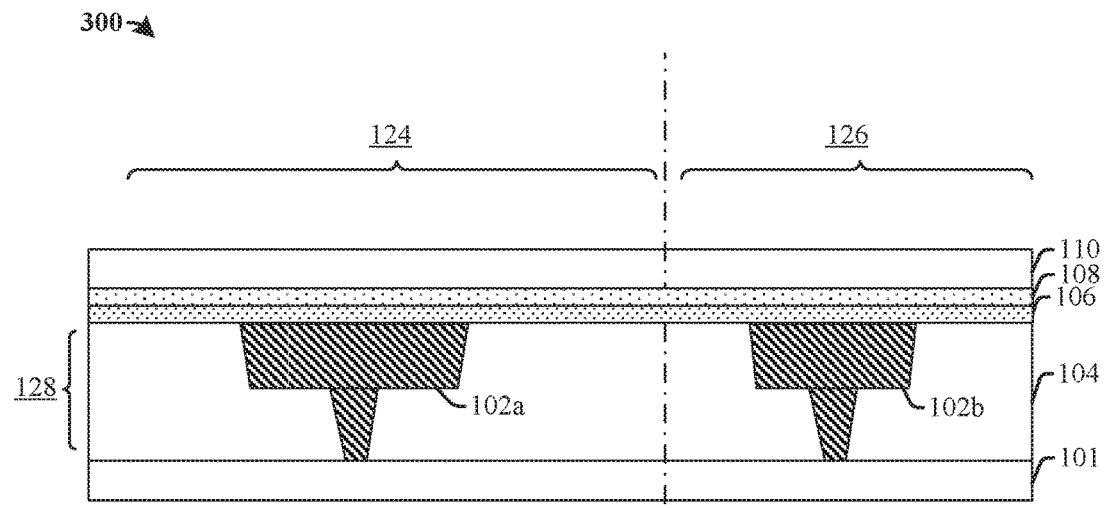
FIGS. 3-13 illustrate cross-sectional views of some embodiments showing a method of manufacturing an integrated circuit (IC).

As shown in cross-sectional view 300 of FIG. 3, a low-k dielectric layer 110 is formed overlying a lower metal layer 128 and extending across a memory region 124 and a logic region 126. In some embodiments, the lower metal layer 128 is formed by forming a lower ILD layer 104 (e.g., an oxide, a low-k dielectric, or an ultra low-k dielectric) over a substrate 101, followed by a damascene process to form openings within the lower ILD layer and fill a metal material (e.g., copper, aluminum, etc.) into the openings. A planarization process can be then performed to remove excess metal material to form the lower metal layer 128. The lower metal layer 128 is formed to have a first lower metal line 102a at the memory region 124 and a second lower metal line 102b at the logic region 126. In some embodiments, the lower metal layer 128 may be disposed within a back-end-of-the-line (BEOL) metal interconnect stack. A bottom etch stop layer 106 and a protective layer 108 can be formed between the lower metal layer 128 and the low-k dielectric layer 110. In some embodiments, the bottom etch stop layer 106 may comprise silicon-nitride (SiN), silicon-carbide (SiC), or a similar composite dielectric film. In some embodiments, the protective layer 108 may comprise silicon nitride, tetraethyl orthosilicate (TEOS), silicon-rich oxide (SRO), or a similar composite dielectric film. In some embodiments, the bottom etch stop layer 106 and the protective layer 108 may be formed by a vapor deposition technique (e.g., physical vapor deposition, chemical vapor deposition, etc.).

Figure 4:
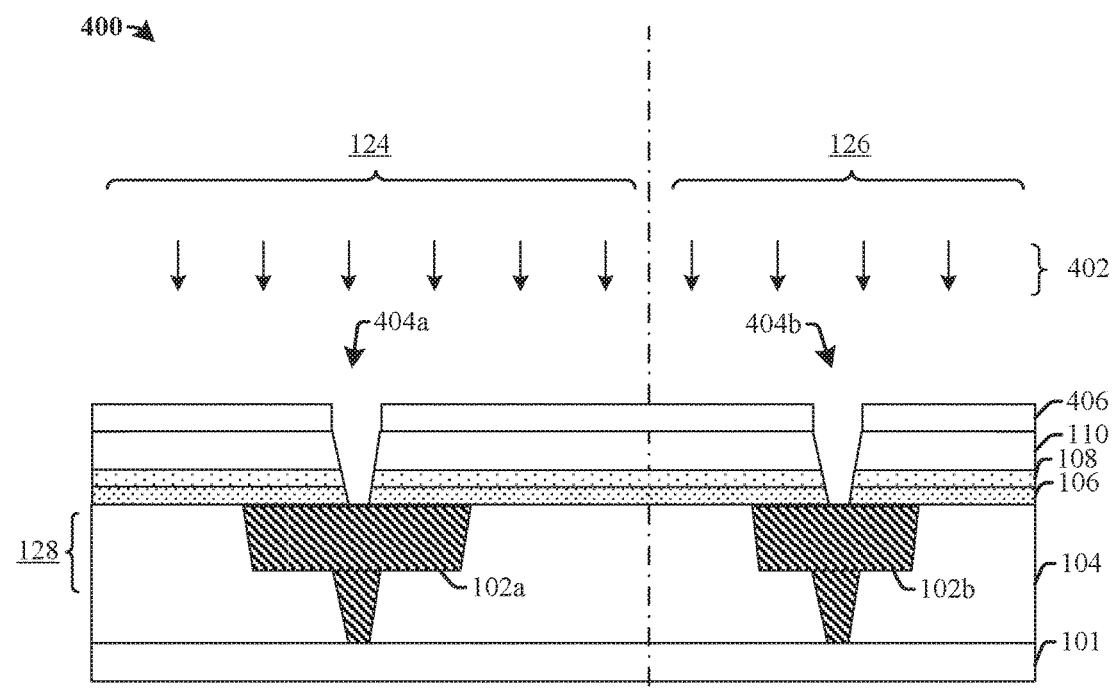

As shown in cross-sectional view 400 of FIG. 4, a mask layer 406 is formed and patterned over the low-k dielectric layer 110. An etching process 402 is performed to form a first recess 404a and a second recess 404b through the low-k dielectric layer, the protective layer 108, and the bottom etch stop layer 106, and reach onto the lower metal layer 128. The mask layer 406 can be a photoresist layer having openings corresponding to the first and second recesses 404a, 404b to be formed. In some embodiments, the first and second recesses 404a, 404b can be formed through a dry etch process such as a plasma etching. The first recess 404a is formed at the memory region 124 reaching the first lower metal line 102a and the second recess 404b is formed at the logic region 126 reaching the second lower metal line 102b.

Figure 5:
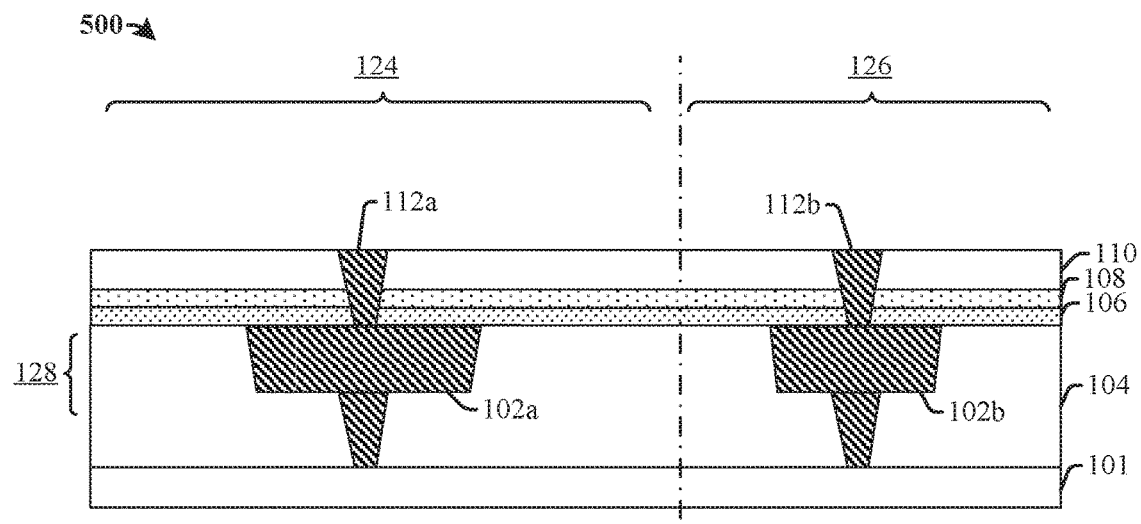

As shown in cross-sectional view 500 of FIG. 5, a metal material (e.g., copper, aluminum, etc.) is filled into the openings (404a, 404b of FIG. 4). A planarization process is then performed to remove excess metal material to form a first lower metal via 112a and a second lower metal via 112b.

Figure 6:
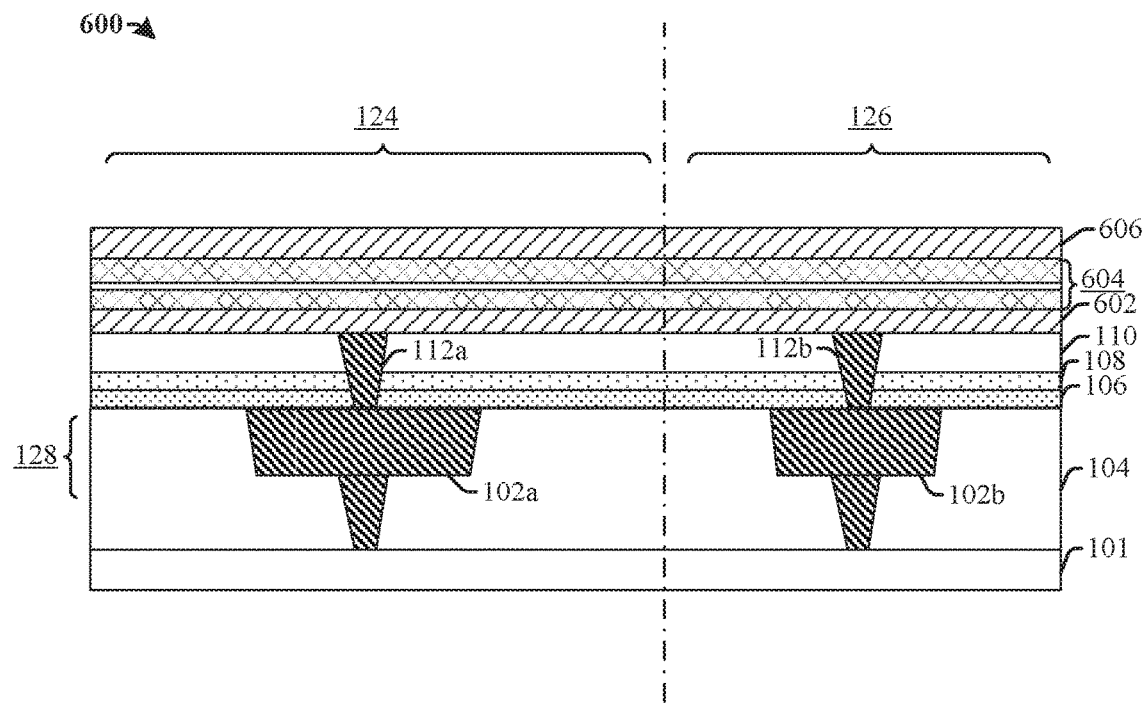

As shown in cross-sectional view 600 of FIG. 6, a bottom electrode layer 602, a resistance switching layer 604, and a top electrode layer 606 are formed over the lower metal vias 112a, 112b and the lower low-k dielectric layer 110 in succession. These layers can be formed by a series of vapor deposition techniques (e.g., physical vapor deposition, chemical vapor deposition, etc.). Though not shown in figures, in some embodiments, a diffusion barrier layer may be deposited prior to depositing the bottom electrode layer 602. A hard mask layer and/or a photoresist layer (not shown) may be formed on the top electrode layer 606 to facilitate the patterning of the memory cell. In some embodiments, the resistance switching layer 604 may comprise a RRAM dielectric layer such as metal oxide composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) as in its relative high resistance state and a metal such as titanium (Ti), hafnium (Hf), platinum (Pt), ruthenium (Ru), and/or aluminum (Al) as in its relative low resistance state. In some embodiments, the resistance switching layer 604 may comprise a magnetic tunnel junction (MTJ) structure having a bottom ferromagnetic layer and a top ferromagnetic layer separated by a tunnel barrier layer. In various embodiments, the bottom electrode layer 602 and the top electrode layer 606 may comprise a metal nitride (e.g., titanium nitride (TiN) or tantalum nitride (TaN) and/or a metal (e.g., titanium (Ti) or tantalum (Ta)).

Figure 7:
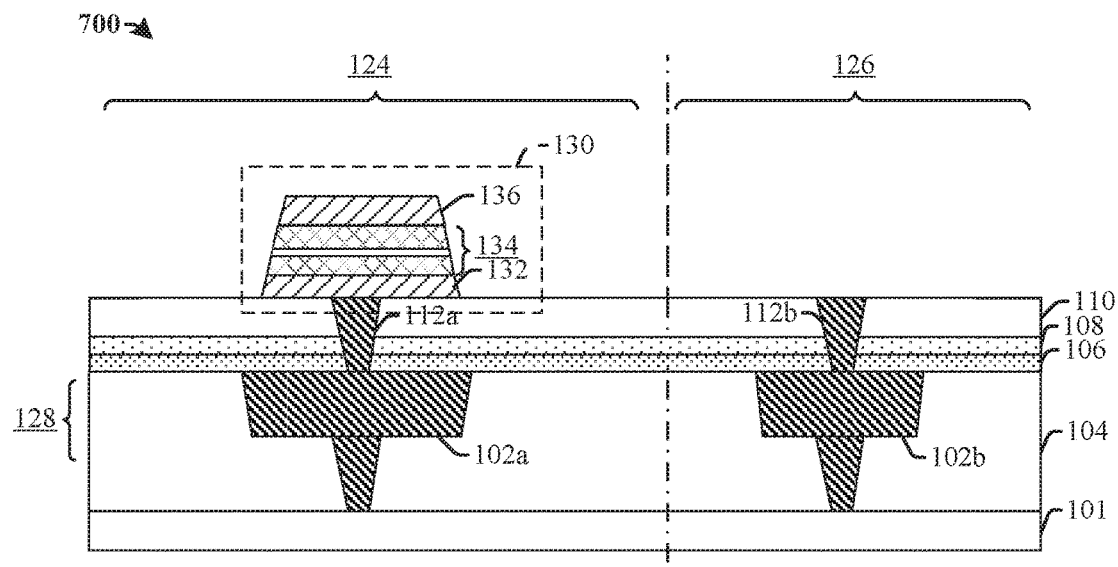

As shown in cross-sectional view 700 of FIG. 7, the top electrode layer 606, the resistance switching layer 604, and the bottom electrode layer 602 (shown in FIG. 6) are patterned to form a top electrode 136, a resistance switching element 134 and a bottom electrode 132 for a memory cell 130 at the memory region 124. In some embodiments, the sidewalls of the top electrode 136, the resistance switching element 134 and the bottom electrode 132 can be tilted and aligned (e.g. co-planar). In some other embodiments, the bottom electrode layer 602 (shown in FIG. 6) can be patterned according to the top electrode 136 and the resistance switching element 134, and according to an additional spacer alongside the top electrode 136 and the resistance switching element 134 (not shown). In some embodiments, the patterning process can comprise a dry etching process that may have an etchant chemistry including $CF_4$, $CH_2F_2$, $Cl_2$, $BCl_3$ and/or other chemicals.

Figure 8:
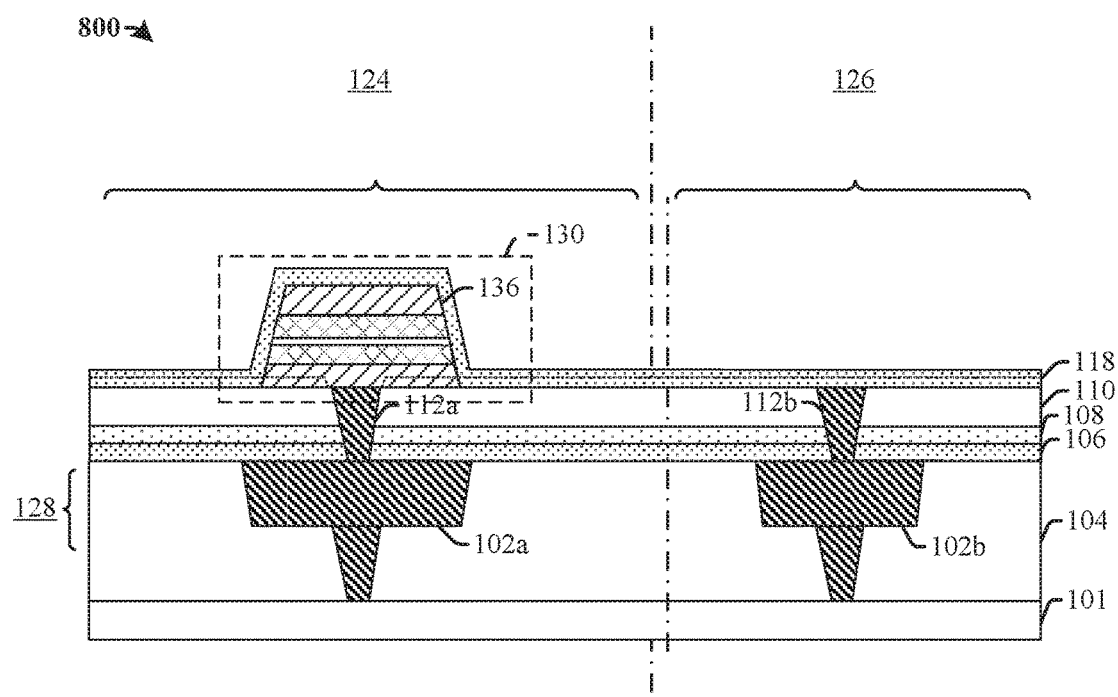

As shown in cross-sectional view 800 of FIG. 8, a bottom etch stop layer 118 is formed over the low-k dielectric layer 110, along outer sidewalls of the memory cell 130, and may extend to cover a top surface of the top electrode 136. In some embodiments, the bottom etch stop layer 118 is a conformal dielectric liner and may extend cross the memory region 124 and the logic region 126. The bottom etch stop layer 118 may comprise silicon-nitride (SiN), silicon-carbide (SiC), or a similar composite dielectric film. In some embodiments, the bottom etch stop layer 118 may be formed by a vapor deposition technique (e.g., physical vapor deposition, chemical vapor deposition, etc.). In some alternative embodiments, the bottom etch stop layer 118 can be deposited on the lower low-k dielectric layer 110 prior to forming the bottom electrode layer 602 (shown in FIG. 6) and re-deposited after forming the memory cell 130 as described above. In this case, the bottom etch stop layer 118 may have a lower portion extending under the bottom electrode 132, as shown by dotted lines.

Figure 9:
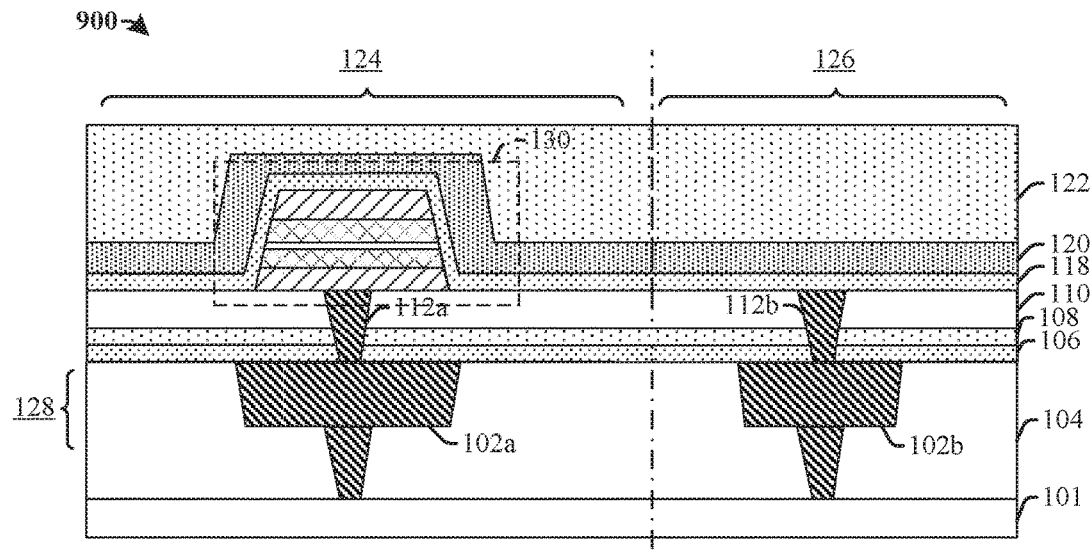

As shown in cross-sectional view 900 of FIG. 9, a memory dielectric layer 122 is formed over the bottom etch stop layer 118. In some embodiments, a spacer layer 120 can be formed along an upper surface of the bottom etch stop layer 118 prior to forming the memory dielectric layer 122. In some embodiments, the spacer layer 120 and the memory dielectric layer 122 may respectively comprise silicon nitride, tetraethyl orthosilicate (TEOS), silicon-rich oxide (SRO), or a similar composite dielectric film. In some embodiments, the spacer layer 120 and the memory dielectric layer 122 may respectively be formed by a vapor deposition technique (e.g., physical vapor deposition, chemical vapor deposition, etc.).

Figure 10:
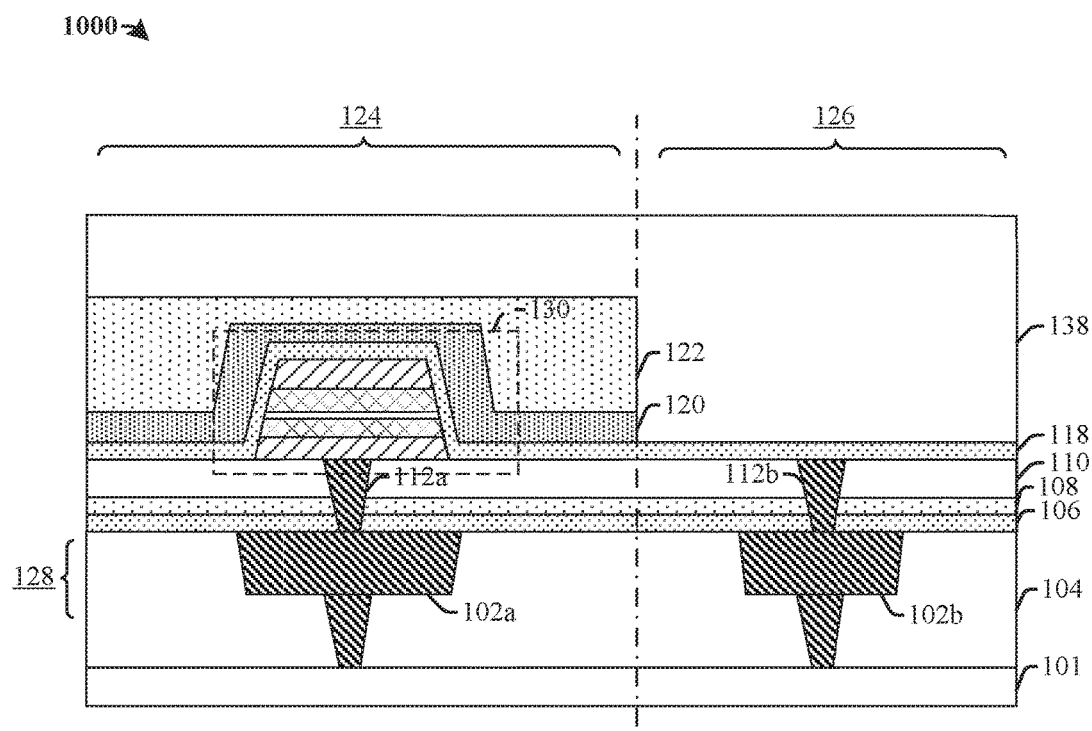

As shown in cross-sectional view 1000 of FIG. 10, the memory dielectric layer 122 is patterned and removed from the logic region, and an ILD layer 138 is formed over the bottom etch stop layer 118 within the memory region 124. In some embodiments, the ILD layer 138 may comprise an oxide layer, a low-k dielectric layer, or an ultra-low-k dielectric layer formed by a deposition process (e.g., CVD, PECVD, PVD, etc.).

Figure 11:
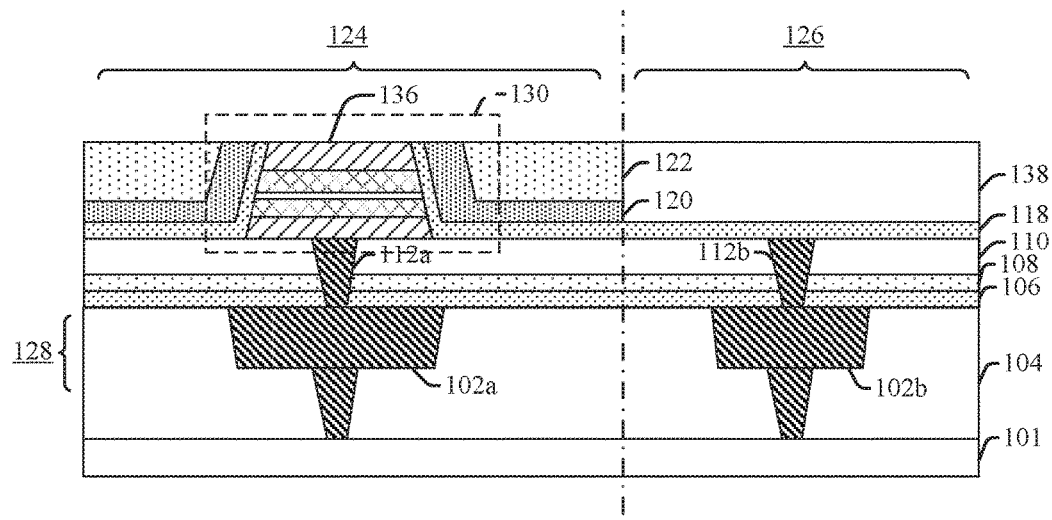

As shown in cross-sectional view 1100 of FIG. 11, a planarization process is then performed to remove excessive ILD layer 138 and/or the memory dielectric layer 122. In some embodiments, the bottom etch stop layer 118 and the spacer layer 120 are also lowered, such that a top surface of the top electrode 136 is exposed. The memory dielectric layer 122, the bottom etch stop layer 118 and the spacer layer 120 can be lowered in the same planarization process or in separate planarization processes prior to forming the ILD layer 138.

Figure 12:
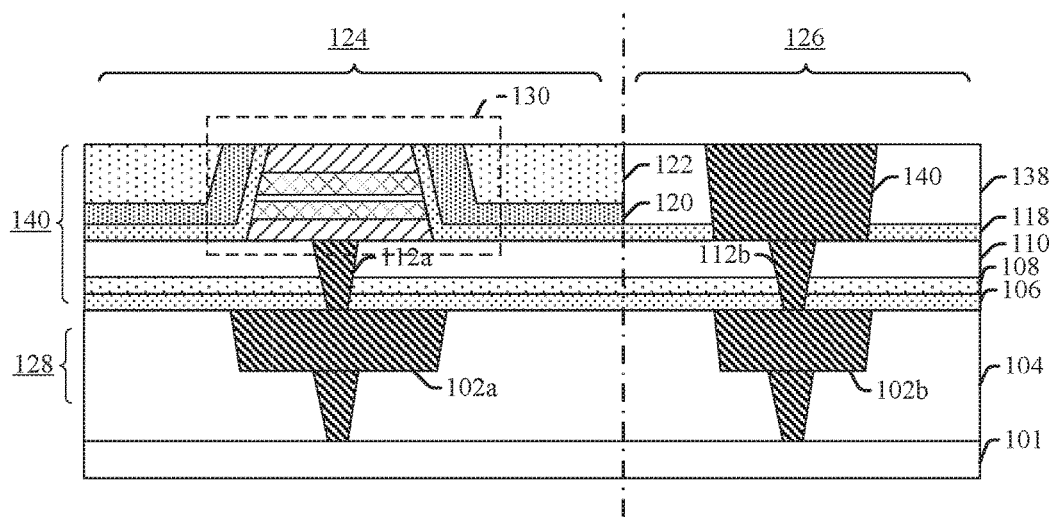

As shown in cross-sectional view 1200 of FIG. 12, an intermediate metal layer 140, including an intermediate metal line 140, is formed through the ILD layer 138 and the bottom etch stop layer 118 within the logic region 126. In some embodiments, a damascene process is used to form openings within the ILD layer 138 and fill a metal material (e.g., copper, aluminum, etc.) into the openings. A planarization process can be then performed to remove excess metal material.

Figure 13:
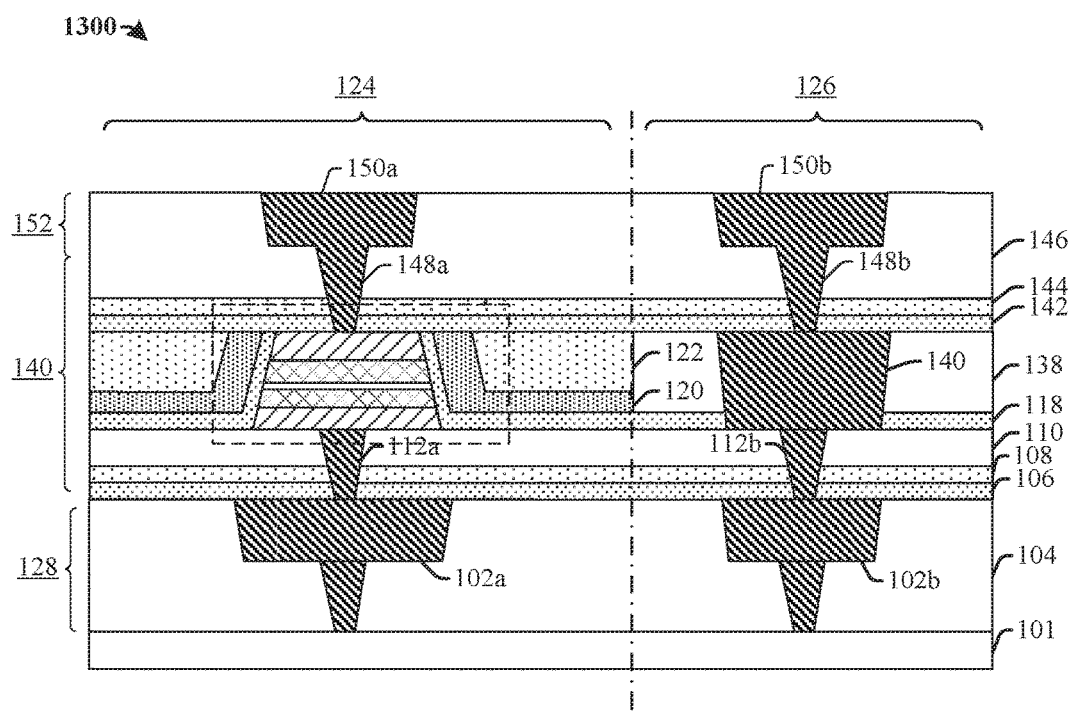

As shown in cross-sectional view 1300 of FIG. 13, an upper ILD layer 146 and an upper metal layer 152 is formed over the memory cell 130, the intermediate metal layer 140, and the ILD layer 138. The upper metal layer 152 may comprise a first upper metal line 150a coupled to the memory cell 130 at the memory region 124 through a first upper metal via 148a, and a second upper metal line 150b coupled to the intermediate metal line 140 at the logic region 126 through a second upper metal via 148b. In some embodiments, an upper etch stop layer 142 and/or a protective liner 144 are disposed surrounding a lower portion of the upper metal vias 148a, 148b. In some embodiments, a damascene process (including but not limited to a dual damascene process) is used to form vias of the intermediate metal layer 140 and metal lines of the upper metal layer 152. Trenches and via holes are formed through the upper ILD layer 146, and then filed with a conductive material (e.g., copper). A planarization is then performed.

Figure 14:
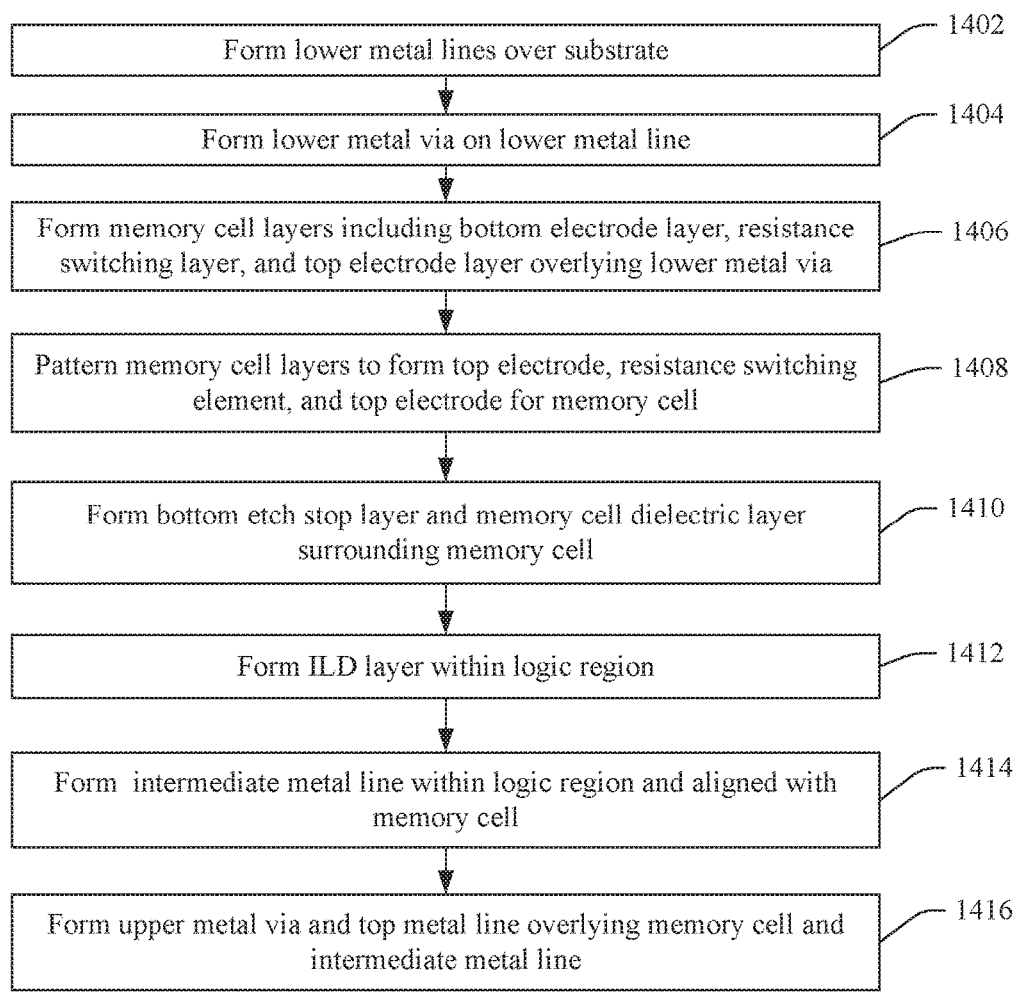
FIG. 14 illustrates a flow diagram of some embodiments of a method of manufacturing an integrated circuit (IC).

FIG. 14 shows some embodiments of a flow diagram of a method 1400 of forming a flash memory device. Although method 1400 is described in relation to FIGS. 3-13, it will be appreciated that the method 1400 is not limited to such structures disclosed in FIGS. 3-13, but instead may stand alone independent of the structures disclosed in FIGS. 3-13. Similarly, it will be appreciated that the structures disclosed in FIGS. 3-13 are not limited to the method 1400, but instead may stand alone as structures independent of the method 1400. Also, while disclosed methods (e.g., method 1400) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a lower metal layer is formed over a substrate including a plurality of lower metal lines within a memory region and a logic region. In some embodiments, the lower metal layer is formed by forming a lower ILD layer over the substrate, followed by a damascene process to form openings within the lower ILD layer and fill a metal material (e.g., copper, aluminum, etc.) into the openings. A low-k dielectric layer is then formed overlying the lower metal layer. FIG. 3 illustrates some embodiments of a cross-sectional view 300 corresponding to act 1402.

At 1404, a lower metal via is formed within the low-k dielectric layer on the lower metal lines of the lower metal layer. In some embodiments, the lower metal via is formed by a damascene process. FIGS. 4-5 illustrate some embodiments of cross-sectional views 400, 500 corresponding to act 1404.

At 1406, memory cell layers including a bottom electrode layer, a resistance switching layer, and a top electrode layer are formed over the lower metal via and the lower low-k dielectric layer in succession. FIG. 6 illustrates some embodiments of a cross-sectional view 600 corresponding to act 1406.

At 1408, the memory cell layers are patterned to form a top electrode, a resistance switching element, and a bottom electrode for a memory cell within a memory region. FIG. 7 illustrates some embodiments of a cross-sectional view 700 corresponding to act 1408.

At 1410, a bottom etch stop layer is formed over the low-k dielectric layer, along outer sidewalls of the memory cell, and may extend to cover a top surface of the top electrode. A memory dielectric layer is formed over the bottom etch stop layer within the memory region. FIGS. 8-9 illustrate some embodiments of cross-sectional views 800, 900 corresponding to act 1410.

At 1412, an ILD layer is formed over the bottom etch stop layer within the logic region. In some embodiments, a planarization process is performed such that upper surfaces of the top electrode, the memory dielectric layer and the ILD layer are aligned. FIGS. 10-11 illustrate some embodiments of cross-sectional views 1000, 1100 corresponding to act 1412.

At 1414, an intermediate metal line is formed through the ILD layer within the logic region to reach on one of the lower metal lines. FIG. 12 illustrates some embodiments of a cross-sectional view 1200 corresponding to act 1414.

At 1416, a first upper metal via and a second upper metal via are formed directly abutting the top electrode of the memory cell or the intermediate metal line. The upper metal vias respectively connect the memory cell and the intermediate metal line to upper metal lines formed there above. FIG. 13 illustrates some embodiments of a cross-sectional view 1300 corresponding to act 1416.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In some embodiment, the present disclosure relates to an integrated circuit (IC) including a memory region and a logic region. The IC comprises a substrate, a lower metal layer disposed over the substrate, and an upper metal layer overlying the lower metal layer. The lower metal layer comprises a first lower metal line within the memory region and a second lower metal line within the logic region. The upper metal layer comprises a first upper metal line within the memory region and a second upper metal line within the logic region. The IC further comprises a memory cell disposed between the first lower metal line and the first upper metal line, and comprising a planar bottom electrode and a top electrode separated from the bottom electrode by a resistance switching element. The memory cell is respectively connected to the first lower metal line through a first lower metal via abutting the planar bottom electrode and the first upper metal line through a first upper metal via abutting the top electrode.

In another embodiment, the present disclosure relates to an integrated circuit (IC) including a memory region and a logic region. The IC comprises a substrate and an interconnect structure disposed over the substrate. The interconnect structure comprises a plurality of metal layers disposed over one another and surrounded by interlayer dielectric (ILD) materials. The plurality of metal layers is connected by a plurality of metal vias. The IC further comprises a plurality of memory cells arranged within the memory region and arranged between a lower metal layer and an upper metal layer of the interconnect structure that are noncontiguous from one another. A memory cell comprises a bottom electrode disposed on a lower metal via of the lower metal layer and a surrounding lower ILD layer, a resistance switching element disposed over the bottom electrode, and a top electrode disposed over the resistance switching element and abutting a top metal via. The bottom electrode, the resistance switching element, and the top electrode have tiled sidewalls co-planar with one another.

In yet another embodiment, the present disclosure relates to a method of manufacturing an integrated circuit (IC). The method comprises forming a lower metal layer extending across a memory region and a logic region within a lower inter-layer dielectric (ILD) layer over a substrate and forming a lower metal via on a lower metal line of the lower metal layer within the memory region and a lower low-k dielectric layer surrounding the lower metal via. The method further comprises forming a bottom electrode layer, a resistance switching layer, and a top electrode layer in succession over the lower metal via and the lower low-k dielectric layer and patterning the bottom electrode layer, the resistance switching layer, and the top electrode layer to form a bottom electrode, a resistance switching element, and a top electrode for a memory cell and to remove from the logic region. The method further comprises forming an upper metal via on the top electrode and an upper low-k dielectric layer surrounding the upper metal via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit (IC) including a memory region and a logic region, comprising:
   a substrate;

a lower metal layer disposed over the substrate, and comprising a first lower metal line within the memory region and a second lower metal line within the logic region;

an upper metal layer overlying the lower metal layer, and comprising a first upper metal line within the memory region and a second upper metal line within the logic region;

a memory cell disposed between the first lower metal line and the first upper metal line, and comprising a bottom electrode and a top electrode separated from the bottom electrode by a resistance switching element, wherein the memory cell is respectively connected to the first lower metal line through a first lower metal via abutting the bottom electrode and the first upper metal line through a first upper metal via abutting the top electrode; and an intermediate metal line disposed between the second lower metal line and the second upper metal line, and connected to the second lower metal line through a second lower metal via and the second upper metal line through a second upper metal via;

wherein the intermediate metal line has a height substantially equal to a height of the memory cell.

2. The IC of claim 1, wherein the first lower metal via and the first upper metal via respectively have heights equal to a height of the memory cell.

3. The IC of claim 1, further comprising:
a lower interlayer dielectric (ILD) layer surrounding the lower metal layer; and
a bottom etch stop layer disposed over the lower ILD layer and the lower metal layer and extending upwardly along sidewalls of the memory cell.

4. The IC of claim 3, further comprising:
a spacer layer disposed along an upper surface of the bottom etch stop layer within the memory region; and
a memory dielectric layer disposed over the spacer layer and having an upper surface laterally aligned with an upper surface of the top electrode.

5. The IC of claim 4, further comprising:
a low-k dielectric layer disposed over the bottom etch stop layer within the logic region and having an upper surface laterally aligned with an upper surface of the top electrode;
wherein the low-k dielectric layer has a dielectric constant smaller than that of the memory dielectric layer.

6. The IC of claim 4, wherein the bottom etch stop layer comprises silicon carbide.

7. The IC of claim 4, wherein the spacer layer comprises silicon nitride.

8. The IC of claim 4, wherein the memory dielectric layer comprises TEOS (Tetraethyl Orthosilicate).

9. The IC of claim 1,
wherein the lower metal layer and the upper metal layer are made of copper;
wherein the bottom electrode and the top electrode comprise titanium nitride (TiN), tantalum nitride (TaN), tantalum (Ta), and/or titanium (Ti).

10. The IC of claim 1, wherein the memory cell is a magnetoresistive random access memory (MRAM) cell, the resistance switching element of the MRAM cell comprising:
a bottom ferromagnetic layer disposed over the bottom electrode;
a tunnel barrier layer disposed over the bottom ferromagnetic layer; and
a top ferromagnetic layer disposed over the tunnel barrier layer.

11. The IC of claim 1, wherein the memory cell is a resistive random access memory (RRAM) cell comprising a bottom electrode and a top electrode separated by a RRAM dielectric layer.

12. An integrated circuit (IC) including a memory region and a logic region, comprising:
a substrate;
an interconnect structure disposed over the substrate, the interconnect structure comprising a plurality of metal layers stacked over one another and surrounded by interlayer dielectric (ILD) materials, the plurality of metal layers including a plurality of metal lines being connected by a plurality of metal vias;
a plurality of memory cells arranged within the memory region and arranged between a lower metal layer and an upper metal layer of the interconnect structure that are noncontiguous from one another, a memory cell comprising:
a bottom electrode disposed on a lower metal via of the lower metal layer and a lower ILD layer surrounding the lower metal via;
a resistance switching element disposed over the bottom electrode; and
a top electrode disposed over the resistance switching element and
abutting an upper metal via;
a bottom etch stop layer disposed on the lower ILD layer within the memory region and the logic region, and extending upwardly along sidewalls of the memory cell; and
a spacer layer disposed along an upper surface of the bottom etch stop layer within the memory region.

13. The IC of claim 12, further comprising:
a memory dielectric layer disposed within the memory region overlying and surrounding the bottom etch stop layer; and
a low-k dielectric layer disposed within the logic region overlying the bottom etch stop layer.

14. The IC of claim 12, wherein the lower ILD layer comprises a low-k dielectric material and is separated from a lower metal line of the lower metal layer disposed underlying the lower metal via.

15. A method for manufacturing an integrated circuit, comprising:
forming a lower metal layer extending across a memory region and a logic region within a lower inter-layer dielectric (ILD) layer over a substrate;
forming a lower metal via on a lower metal line of the lower metal layer within the memory region and a lower low-k dielectric layer surrounding the lower metal via;
forming a bottom electrode layer, a resistance switching layer, and a top electrode layer in succession over the lower metal via and the lower low-k dielectric layer;
patterning the bottom electrode layer, the resistance switching layer, and the top electrode layer to form a bottom electrode, a resistance switching element, and a top electrode for a memory cell and to remove from the logic region;
forming a bottom etch stop layer on the lower low-k dielectric layer surrounding the memory cell;
forming a memory dielectric layer over the bottom etch stop layer;
patterning the memory dielectric layer to remove from the logic region; and forming an upper metal via on the top electrode and an upper low-k dielectric layer surrounding the upper metal via.

16. The method of claim 15, further comprising:

forming a low-k dielectric layer overlying the memory dielectric layer within the memory region and on the bottom etch stop layer within the logic region; and performing a planarization process to remove excessive portions of the low-k dielectric layer and/or the memory dielectric layer and to form upper surfaces of the low-k dielectric layer and the memory dielectric layer laterally aligned.

17. The method of claim 16, further comprising:

forming an intermediate metal line through the lower low-k dielectric layer to reach on the lower metal layer within the logic region;

wherein the intermediate metal line has a substantially equal height with the memory cell.

18. The method of claim 16, further comprising:

forming a spacer layer between the bottom etch stop layer and the memory dielectric layer;

wherein an outer sidewall of the spacer layer is vertically aligned with that of the memory dielectric layer.

19. The method of claim 18, wherein the top electrode of the memory cell, the spacer layer, and the memory dielectric layer are formed to have top surfaces laterally aligned.

20. The IC of claim 1, wherein the first lower metal via has a height substantially equal to a height of the second lower metal via.

* * * * *